United States Patent Office 3,598,669

Patented Aug. 10, 1971

3,598,669

METHOD OF RAPIDLY ETCHING SILICON NITRIDE IN MANUFACTURE OF SEMICONDUCTOR DEVICES

Else Kooi, Emmasingel, Endhoven, Netherlands, assignor to U.S. Philips Corporation, New York, N.Y.

No Drawing. Filed Sept. 14, 1967, Ser. No. 667,639
Claims priority, application Netherlands, Sept. 15, 1966, 6613011
Int. Cl. C23c *11/08;* H01l *7/00*
U.S. Cl. 156—17 3 Claims

ABSTRACT OF THE DISCLOSURE

A method of manufacturing a semiconductor device is described in which selected portions of a silicon nitride layer are rapidly etched off by first heating in an oxygen-containing atmosphere in the presence of lead oxide to convert to a mixed lead-silicon-oxide and then etched with hydrofluoric acid.

The invention relates to the manufacture of semiconductor devices, more particularly to planar type semiconductor devices.

In the manufacture of such devices, the silica layers are often replaced by silicon nitride layers for masking purposes for example patterns for doping, etching patterns and the like, and/or for insulation and/or passivation of the surfaces. This is due to the fact that silicon nitride is a quite inert substance, having very satisfying insulation properties. Furthermore the diffusion of various conventional dopants such as gallium and zinc, is not blocked by silica layers whereas silicon nitride layers do so.

A disadvantage of the chemically very resistant silicon nitride is however, that it can be removed only with the aid of hydrofluoric acid while there are no materials available for the manufacture of satisfactorily adhering masks inhibiting creep which dissolve in this acid at most only slowly such that during etching the masks are maintained.

It has therefore been proposed to etch the nitride by means of a method known under the name of reversed sputtering. A disadvantage thereof is, however, that this method has to be carried out in high vacuum and requires the use of a high voltage system.

The object of the invention is to enable local removal of the silicon nitride during the manufacture of semiconductor devices in a simple manner.

The invention relates to a method of manufacturing semiconductor devices, more particularly planar type semiconductor devices, in which silicon nitride layers for masking, insulation and/or passivation of the surfaces are locally removed by means of masks and is characterized in that the nitride is oxidized in the presence of lead oxide in an oxygen-containing atmosphere, the oxidized nitride being converted by a reaction with lead oxide to a mixed oxide of lead and silicon, and this mixed oxide is finally removed by dissolving it in a hydrofluoric acid solution.

In accordance with the invention use is made of the known fact that in the presence of a given oxide silicon nitride may be oxidized easily in an oxygen containing atmosphere.

The metal oxide is heated at a temperature at which it dissociates and it is assumed that the oxidation of the nitride is produced by the atomic oxygen evolved during the dissociation. Only a small quantity of the metal oxide is required, since it need operate only as a transfer, not as a source of the atomic oxygen.

Of the oxides having this known effect, lead monoxide is chosen for carrying out the method according to the invention, since it appears to be operative already at temperature between 500 and 700° C. and the oxidation product with a further quantity of lead oxide can be converted into a mixed oxide of lead and silicon which dissolves considerably more rapidly in hydrofluoric acid solutions than the unconverted silicon nitride. Moreover, the conductivity properties of the conventional semiconductor materials are not or substantially not affected by lead oxide. For carrying out the method according to the invention, on the contrary, materials are available for the patterns since they need not fulfil the requirement of dissolving so slowly in the hydrofluoric acid that the patterns made of this material are maintained during a prolonged etching operation, such as required when etching the silicon nitride itself by hydrofluoric acid.

The materials for the patterns in the method according to the invention are required to withstand, in the oxidizing atmosphere, temperatures of at most between 500 and 700° C. and, of course to be applied in satisfactorily adhering layers of great density, which enables a choice among various materials, for example various metals, such as nickel and gold and furthermore oxides, for example oxides of silicon and aluminum and mixed oxides thereof. Patterns of these substances may be applied in known manner for example by vapour deposition on the silicon nitride layers and using conventional photoresist methods. There is not any objection for the patterns of such substances to dissolve during the removal of the silicon nitride converted to a mixed oxide of lead and silicon by means of hydrofluoric acid, since at this stage of the method the pattern has fulfilled its function already.

The method according to the invention has, apart from the said advantages, a further advantage which is particularly important for the manufacture of planar-type structures.

It has been found that in carrying out the method according to the invention, with patterns of material which absorbs little or no lead oxide, for example metals, at the edges of the pattern silicon nitride exhibits, over a very narrow zone of constant width of a few microns, an accelerated attack so that while the nitride cover on the areas beyond the pattern is maintained, an uncovered pattern of constant, small width can be obtained.

By the conventional methods, for local removal of coatings by etching such a result cannot satisfactorily be obtained since even small deviations of the pattern may produce, with the small width of the zone to be etched off, comparatively large widenings or restrictions of this zone.

The invention will now be described more fully with reference to a few embodiments.

EXAMPLE 1

A silicon wafer is covered in known manner with a layer of silicon nitride of 2000 A. by heating it at 1000° C. in a gas mixture of $SiH_4$ and $NH_3$.

To the nitride layer is applied a layer of, for example. 9000 A. of a mixed oxide of aluminum and silicon by heating the wafer in a gas mixture of oxygen, $Si(OC_2H_5)_4$ and $Al(C_4H_9)_3$ in a manner known as such.

By means of a conventional photo-etching method a pattern of apertures is etched in the $Al_2O_3$-$SiO_2$-layer. The etchant is a mixture of concentrated hydrofluoric acid (50% by weight of HF) and $H_3PO_4$ (phosphoric acid) in a ratio of 1:40 by value.

Then the wafer is heated for 20 minutes at 700° C. in an oxygen atmosphere in the presence of a flat piece of lead oxide, arranged at a distance of 0.3 mm. from the wafer.

The silicon nitride not covered by the pattern is thus converted into a mixed lead-silicon oxide throughout the thickness of the layer. Together with the pattern this mixed oxide is dissolved by treating with diluted hydrofluoric acid (about 5% by weight of HF) during about one minute. This dissolution is performed so rapidly (in a few seconds only) that the remaining silicon nitride pattern is not markedly attacked. The wafer may finally be processed to form a semiconductor device, i.e. by local diffusion of dopants determining the conductivity, as is known as such.

EXAMPLE 2

A silicon wafer is provided with a silicon nitride layer of a thickness of 1000 A. Thereon is deposited from the vapour phase, a nickel layer of a thickness of 2000 A. in which a band pattern is made by a photo-etching method. The etchant for the nickel is diluted nitric acid (about 30% by weight of $HNO_3$), heated at 55° C., the duration of the etching treatment being about 15 seconds.

Then the wafer is heated for only 5 minutes at 700° C. in an oxygen atmosphere in the presence of lead oxide. For this purpose a flat piece of PbO is arranged at a small distance, for example a few tenths of a mm., from the wafer provided with the nickel pattern. After treating with diluted hydrofluoric acid (about 5% by weight of HF), in which the lead-silicon oxide, formed by the conversion of the silicon nitride, is dissolved, a groove of a width of 1 micron is formed at the edges of the nickel pattern, where the silicon nitride is completely removed. At the further parts of the wafer silicon nitride is left behind, that is to say about 1000 A. beneath the nickel and about 500 A. at the uncovered areas.

Finally the nickel is removed by means of nitric acid (about 30% by weight of $HNO_3$). At the area of the grooves, dopants for the silicon may be diffused after which the assembly can be processed further in known manner for obtaining semiconductor devices.

What is claimed is:

1. The method of manufacturing a semiconductor device comprising the steps of forming a layer of silicon nitride on the surface of a body of semiconductor material, covering the silicon nitride layer with a layer of oxides of silicon and aluminum, then etching a pattern in the oxide layer using an etchant selected from the group consisting of hydrofluoric and phosphoric acids and mixtures thereof to expose the selected silicon nitride portions to be subsequently removed, oxidizing the selected portions of the silicon nitride layer by heating the same in the presence of lead monoxide at a temperature between 500° C. and 700° C. in an oxygen containing atmosphere until said selected silicon nitride layer portions are converted into a mixed lead-silicon oxide, and then removing said mixed lead-silicon oxide by dissolving the same in a hydrofluoric acid solution to expose the underlying body surface.

2. The method of claim 1 wherein the non-selected silicon nitride layer portions are protected against oxidation by means of an earlier provided metal mask.

3. The method of claim 1 wherein before the silicon nitride oxidizing step a masking material selected from the group consisting of nickel, gold, oxides of aluminum and silicon and mixtures of oxides of aluminum and silicon is deposited on the silicon nitride layer, the subsequent silicon nitride oxidizing step being thus accelerated along a narrow zone of the silicon nitride adjoining the mask edge, and removing the mixed lead-silicon oxide by the dissolution step only within the said narrow zone.

References Cited

UNITED STATES PATENTS

| | | | |
|---|---|---|---|
| 3,135,638 | 6/1964 | Cheney et al. | 156—17 |
| 3,455,729 | 7/1969 | Deeley et al. | 156—17 |
| 3,463,667 | 8/1969 | Chopra | 117—106 |
| 3,342,650 | 9/1967 | Seki et al. | 148—187 |

OTHER REFERENCES

Kooi: "The Surface Properties of Oxidized Silicon," June 1967, p. 37 cited. Page 37 constitutes a method quoted from the Electrochemical Society Extended Abstracts, vol. 10, pp. 129–30, dated 1961.

ROBERT F. BURNETT, Primary Examiner

R. J. ROCHE, Assistant Examiner

U.S. Cl. X.R.

29—569, 590, 630; 117—106; 148—187